(12) United States Patent
Bruce et al.

(10) Patent No.: US 6,417,068 B1
(45) Date of Patent: Jul. 9, 2002

(54) SEMICONDUCTOR DEVICE NAVIGATION USING LASER SCRIBING

(75) Inventors: Victoria Bruce, Austin, TX (US); Susan Li, Fremont, CA (US); Jeffrey D. Birdsley, Austin, TX (US)

(73) Assignee: Advance Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 09/247,001

(22) Filed: Feb. 8, 1999

(51) Int. Cl.[7] ............................................. H01L 21/76
(52) U.S. Cl. ..................... 438/401; 438/14; 205/307; 205/309; 205/491.1; 205/492.21
(58) Field of Search .................................. 205/307, 309, 205/491.1, 492.21; 438/14, 401

(56) References Cited

U.S. PATENT DOCUMENTS 5,821,549 A * 3/1997 Talbot et al. ............... 250/307

* cited by examiner

*Primary Examiner*—David Nelms
*Assistant Examiner*—Reneé R. Berry

(57) ABSTRACT

According to one aspect of the disclosure, the present invention provides methods and arrangements for milling the substrate of a semiconductor device and exposing a selected region in the substrate. A laser is directed at a selected area of the back side of the device to create a small marker to be used for alignment during the milling process. The substrate is then milled to expose the selected area within the substrate, using the marker as alignment.

15 Claims, 3 Drawing Sheets

SEMICONDUCTOR DEVICE NAVIGATION USING LASER SCRIBING

FIELD OF THE INVENTION

The invention relates to semiconductor device assemblies, and more particularly to techniques for analyzing and debugging circuitry associated with integrated circuits such as those accessible from their back sides.

BACKGROUND OF THE INVENTION

In recent years, the semiconductor industry has realized tremendous advances in technology which have permitted dramatic increases in circuit density and complexity, and equally dramatic decreases in power consumption and package sizes. Present semiconductor technology now permits single-chip microprocessors with many millions of transistors, operating at speeds of hundreds of MIPS (millions of instructions per second) to be packaged in relatively small, air-cooled semiconductor device packages. A by-product of such high-density and high functionality in semiconductor devices has been the demand for increased numbers of external electrical connections to be present on the exterior of the die and on the exterior of the semiconductor packages which receive the die, for connecting the packaged device to external systems, such as a printed circuit board.

To increase the number of pad sites available for a die, different chip packaging techniques have been used. One technique is referred to as a dual in-line package (DIP) in which bonding pads are along the periphery of the device. Another technique, called controlled collapse chip connection or flip-chip packaging, uses the bonding pads and metal (solder) bumps. The bonding pads need not be on the periphery of the die and hence are moved to the site nearest the transistors and other circuit devices formed in the die. As a result, the electrical path to the pad is shorter. Electrical connection to the package is made when the die is flipped over the package with corresponding bonding pads. Each bump connects to a corresponding package inner lead. The resulting packages have a lower profile and have lower electrical resistance and a shortened electrical path. The output terminals of the package may be ball-shaped conductive-bump contacts (usually solder, or other similar conductive material) are typically disposed in a rectangular array. These packages are occasionally referred to as "Ball Grid Array" (BGA). Alternatively, the output terminals of the package may be pins, and such a package is commonly known as pin grid array (PGA) package.

For BGA, PGA and other types of packages, once the die is attached to the package, the back side portion of the die remains exposed. The transistors and other circuitry are generally formed in a very thin epitaxially grown silicon layer on a single crystal silicon wafer from which the die is singulated. The side of the die including the epitaxial layer containing the transistors, and the other active circuitry is often referred to as the circuit side of the die or front side of the die. The circuit side of the die is positioned very near the package. The circuit side opposes the back side of the die. Between the back side and the circuit side of the die is single crystalline silicon. The positioning of the circuit side provides many of the advantages of the flip-chip.

In some instances the orientation of the die with the circuit side face down on a substrate may be a disadvantage or present new challenges. For example, when a circuit fails or when it is necessary to modify a particular chip, access to the transistors and circuitry near the circuit side is typically obtained only from the back side of the chip. This is challenging since the transistors are in a very thin layer (about 10 micrometers) of silicon buried under the bulk silicon (greater than 500 micrometers). Thus, the circuit side of the flip-chip die is not visible or accessible for viewing using optical or scanning electron microscopy.

Techniques have been developed to access the circuit even though the circuit of the integrated circuit (IC) is buried under the bulk silicon. For example, infrared (IR) microscopy is capable of imaging the circuit because silicon is relatively transparent in these wavelengths of the radiation. However, because of the absorption losses of IR radiation in silicon, it is generally required to thin the die to less than 100 microns in order to view the circuit using IR microscopy. On a die that is 725 microns thick, this means removing at least 625 microns of silicon before IR microscopy can be used.

Thinning the die for failure analysis of a flip-chip bonded IC is usually accomplished in two or three steps. The die is first thinned across the whole die surface. This is also referred to as global thinning. Global thinning is done to allow viewing of the active circuit from the back side of the die using IR microscopy. Mechanical polishing is one method for global thinning. Using IR microscopy, an area is identified for accessing to a particular area of the circuit. Local thinning techniques such as laser microchemical etching are used to thin the silicon an area to a level that is thinner than the die size. One method for laser microchemical etching of silicon is accomplished by focusing a laser beam on the back side of the silicon surface to cause local melting of silicon in the presence of chlorine gas. The molten silicon reacts very rapidly with chlorine and forms silicon tetrachloride gas, which leaves the molten (reaction) zone. A specific example silicon-removal process uses the 9850 SiliconEtcher™ tool by Revise, Inc. (Burlington, Mass). This laser process is suitable for both local and global thinning by scanning the laser over a part of, or the whole, die surface.

During failure analysis, or for design debug, it is sometimes helpful to make electrical contact and probe certain circuit nodes on the circuit side or front side of the die. This is generally done by milling through the die to access the node, or milling to the node and subsequently depositing a metal to electrically access the node. These access holes often need to have high aspect ratios. For design debug, it is desirable to have the capability of cutting the interconnect lines and rerouting of the interconnect lines. Milling through silicon with fairly high aspect ratio trenches is slow and is almost impractical for silicon thickness greater than 10 microns. For these reasons, it is necessary to have a method and apparatus which will provide for controlled thinning flip-chip bonded IC devices to less than 10 micron thickness. It is also necessary to have a method where the thickness of the silicon can be determined with sufficient accuracy to avoid milling off the node to which access is being sought, since this could jeopardize further device analysis.

Accurately determining the thickness of the silicon is not readily achieved by thinning the back side to a distance above the package to which the die is attached. Various parts tolerances do not allow for such a simple approaching the circuit side of the die from the back side of the die. One tolerance issue revolves around keeping the height of solder ball contacts on the die substantially uniform for every packaged device of a particular type. Even though the solder ball contacts have a tolerance requirement, when the solder is reflowed to attach the die to a package, the amount of change in height due to solder reflow can vary by several microns. The thickness of the die between the circuit side and back side is also subject to tolerance differences. Since the thickness of the starting silicon wafer is a non-essential parameter for making a functioning die, typically the die thickness is not known to an accurate level. For instance, a typical die for a microprocessor may have a die thickness of 725±15 microns. The end result is tolerance stacking due to the tolerances for the size of the solder balls, the height at which the die is attached and the thickness of the die. These tolerances stack up such that there can be tens of microns of difference in height from the top surface of the package to the top surface of the die among different packaged devices. This can be a significant problem, since the epitaxial layer is only between 2 and 10 microns thick. The thickness of the remaining silicon of a trench cannot be gauged by measuring from the top surface of the package to the bottom of the trench. Stack up of the tolerances of the various parts precludes simply "measuring up" from the package to which the die is attached to determine where the epitaxial layer containing the transistors begins. Simply put, such an approach is not adequately accurate to prevent ruining the circuitry or transistors that must be analysed or debugged. Once the circuitry or transistors are ruined, analysis or debugging is frustrated.

SUMMARY OF THE INVENTION

The present invention provides methods and apparatuses for detecting the location of a portion of the active circuitry in an integrated circuit, for example, near the circuit side of an integrated circuit die. In this manner, guesswork as to the location of the circuitry while the back side of a die is being removed is eliminated, and the ability to navigate during the milling process is improved. Consequently, failure analysis and debugging of the circuitry associated with a particular integrated circuit is improved. Furthermore, when the position of the circuitry with respect to the milling progress is known or can be determined from the back side removal of the silicon, getting to the circuitry can be accomplished in less time.

The difficulty in locating and milling to a selected region of a semiconductor device as discussed above is lessened by the use of the invention herein. In one example embodiment, the present invention involves the use of a method for milling the substrate of a semiconductor device and exposing a selected region in the substrate, wherein the semiconductor device has a circuit side and a back side, and the back side has at least two layers. The back side surface of the semiconductor device is marked with a laser over a selected region in the substrate. A milling device, such as a focused ion beam (FIB), is then directed at the marked area of the back side of the device. Substrate is removed, thereby exposing the selected region.

According to another example embodiment, a semiconductor device used in milling and exposing a selected region in the device. The semiconductor device comprises: a circuit side and a back side; and a laser-formed marker on a surface of the back side of the device, wherein the marker is used for alignment during milling to access the selected region within the device.

According to another example method for milling the substrate of a semiconductor device, the present invention involves means for marking the back side surface of the semiconductor device over a selected region in the substrate. Once the back side surface is marked, means for directing over the marked area of the back side of the device are used. Finally, means for removing the substrate and exposing the selected region in the substrate complete the milling method.

In another embodiment, the invention includes a semiconductor device for use in the semiconductor industry, wherein the semiconductor device includes a circuit side and a back side. The device further comprises a marker on the surface of the back side of the device, wherein the marker may be used, for example, for alignment of a milling device with selected regions within the substrate of the semiconductor device.

In still another embodiment, the invention includes an apparatus for milling the substrate of a semiconductor device and exposing a selected region in the substrate, wherein the semiconductor device includes a circuit side and a back side. The apparatus comprises means for aligning with a selected region within the substrate, means for marking the back side surface of the semiconductor device, and means for removing the substrate.

The methods and apparatus described above significantly improve the manufacture of semiconductor devices. This invention provides the ability to accurately control milling processes used with semiconductor devices, improving the ability to test circuits, troubleshoot defective circuits, and the overall manufacture of such devices. The guesswork and difficulties formerly required with alignment of the milling process are reduced or eliminated.

The above summary is not intended to describe each illustrated embodiment or every implementation of the present invention. The figures and the detailed description which follow more particularly exemplify these embodiments.

BRIEF DESCRIPTION OF THE DRAWINGS

The invention may be more completely understood in consideration of the following detailed description of various embodiments of the invention in connection with the accompanying drawings, in which.

Figure 1:
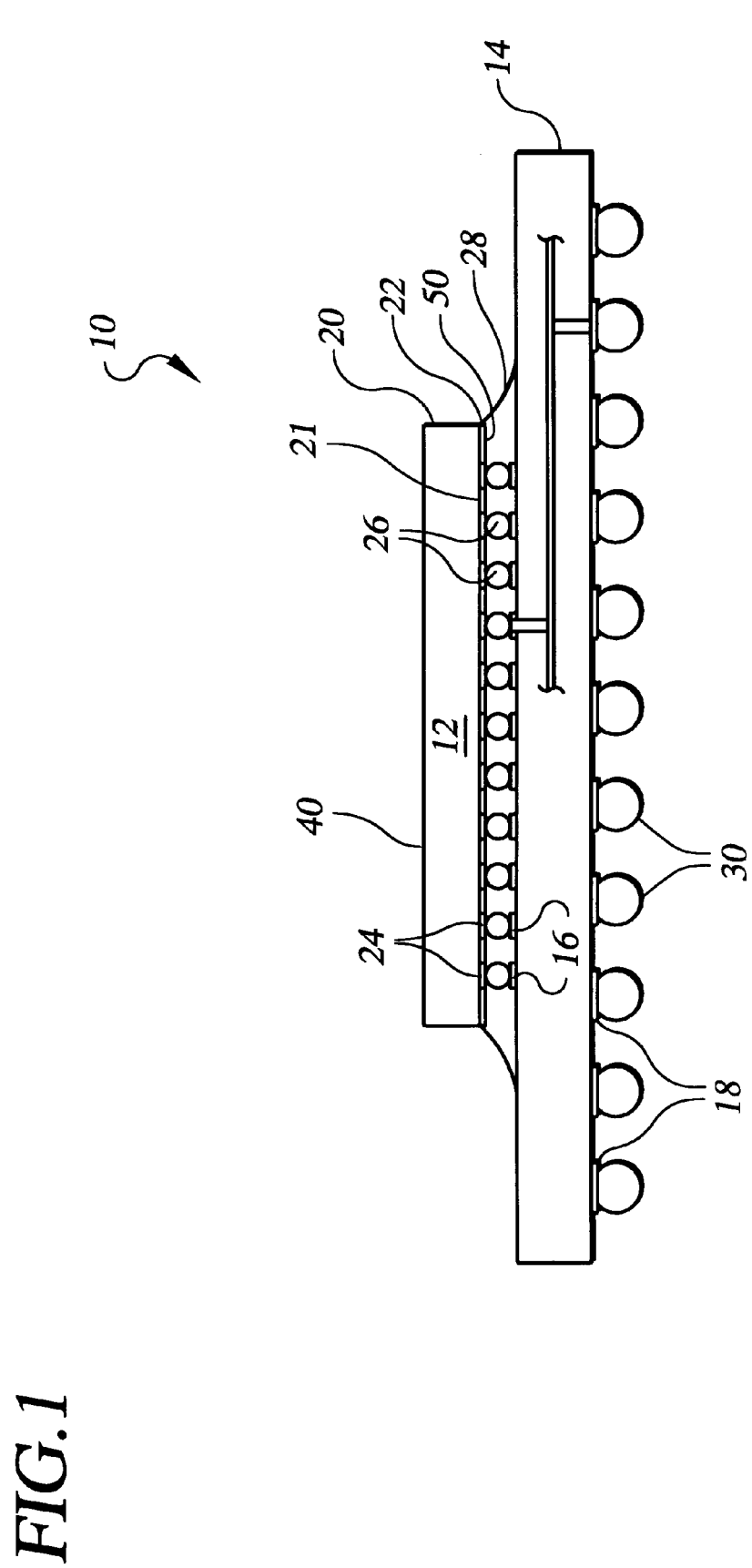
FIG. 1 shows a side view of a flip-chip packaged integrated circuit, according to an example application of the present invention.

While the invention is amenable to various modifications and alternative forms, specifics thereof have been shown by way of example in the drawings and will be described in detail. It should be understood, however, that the intention is not to limit the invention to the particular embodiment described. On the contrary, the invention is to cover all modifications, equivalents, and alternatives falling within the spirit and scope of the invention as defined by the appended claims.

DETAILED DESCRIPTION

The present invention is believed to be advantageous for use with a variety of different types of integrated circuit packages and has been found to be particularly advantageous for use in connection with accessing the back side of flip-chip integrated circuit packages ("flip-chips"). While the invention is not so limited, the invention can be appreciated using such an application, along with particular example embodiments, as a discussion tool.

FIG. 1 shows a side view 10 of a flip-chip type die 12 assembled to a package substrate 14, according to an example embodiment of the present invention. Flip-chip die 12 has a circuit side 50 and a back side 40. The circuit side 50 includes a number of circuit devices formed near the circuit side in a portion of the die known as the epitaxial layer 22. As discussed and illustrated in connection with FIG. 2, the flip-chip die 12 includes one or more laser-formed markings ("laser zaps") aligned over a selected area 230 in the substrate. In certain applications, the laser-zaps are used for visually aligning (via an optical microscope) access equipment, such as probes, and etching or milling devices. It will be understood that "an access equipment" that removes material refers to one or more devices used to achieve the material removal, and that "an access equipment" that provides analysis feedback, such as images and other information that can be intelligently analyzed, refers to one or more devices used to facilitate or acquire the fedback information.

The epitaxial layer 22 has a thickness in the range of 1 to 15 microns. The portion of the die shown above the epitaxial layer is known as the bulk polysilicon layer 20. Between the epitaxial layer 22 and the bulk polysilicon layer 20 is an example selected region in the substrate 21 to which milling is desired. The region 21 is illustrated in greater detail in FIGS. 2 and 4, enlarged for clarity and illustrated not-to-scale. A plurality of solder bumps 26 are made on the circuit side 50 at pads 24. The solder bumps 26 are the inputs and outputs to the circuitry associated with the die 12. The flip-chip type die 12 is attached to package substrate 14, such as a package for a flip-chip via the solder bumps on the die 12, The package substrate 14 includes pads 16 which are arranged to correspond to the pattern of solder bumps on the die 12. The region between integrated circuit 12 and package substrate 14 is filled with an under-fill material 28 to encapsulate the solder bump connections and provide additional mechanical benefits. The pads 16 are coupled via circuitry to pads 18 on the package substrate. Solder bumps 30 are formed on the pads 18. The solder bumps 30 are the inputs and outputs to the circuitry associated with the package substrate 14.

Figure 2:
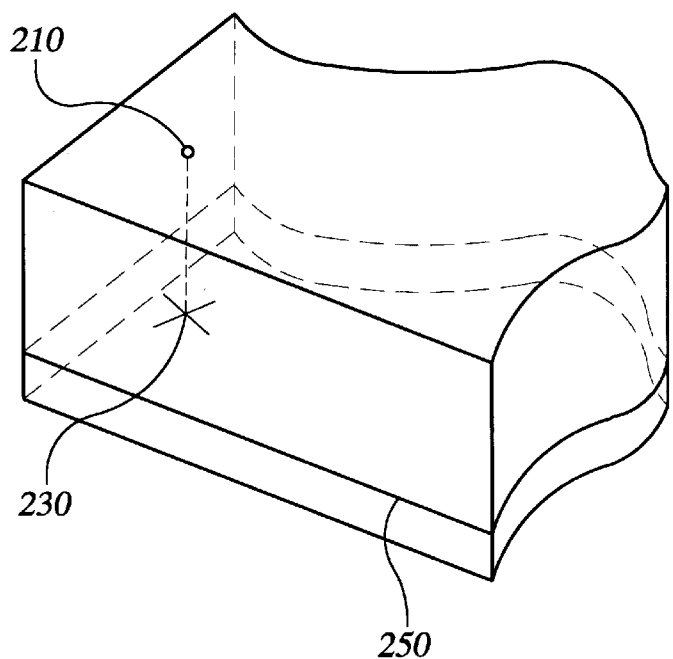
FIG. 2 is an enlarged partial view of a flip-chip die with a laser zap aligned over a selected area in the substrate, also according to the present invention.

FIG. 2 is an enlarged partial view of a flip-chip die with a laser zap 210 aligned over a selected area 230 in the substrate. The selected area 230 is represented by a cross in the form of an "X". The laser zap 210 is shown aligned directly above the center of the selected area 230, as shown by the centerline extending from the selected area 230 to the zap 210. The selected region 230 is in the plane represented by edge 250. Positioning a laser zap directly above the selected area enables accurate identification of the location in which to begin when milling the back side of the semiconductor device to expose a selected region in the substrate. The power level required to establish a mark is relatively low, and may be increased as desired for more visibly-detectable marks.

For example, a selected region in the substrate may be imaged with a laser sweep. A Coumerin die may also be used with the laser. The circuitry within the device may exhibit a glow, providing an indication of its location. Once the circuitry is located, the laser sweeping device may be used to create a laser zap in the surface of the back side of the semiconductor device. The location of the laser zap on the surface corresponds to the location of the circuitry within the device, and may be used as a guide for milling the device. Other methods of locating the selected region may include, for instance, the use of infrared micrscopy or an alignment tool with layout information such as that available from Knights Technology, Inc.

According to one application, the flip-chip die includes a plurality, in one instance four, laser zaps aligned along the edges or corners of the die surface. These four laser zaps are used as course-alignment reference points for a milling process in which an initial larger box (or window) is removed from atop the die surface. Within the larger window, fine focus may be obtained (for example, via an optical microscope) over a selected area, such as area 230 of FIG. 2. Once visual contact with the selected area is achieved, another laser zap (or marker) can be used for alignment as a smaller window is milled (in some applications more slowly) within the borders of the larger window until the desired depth and proximity to the targeted circuit area is reached. The targeted circuit area may then be accessed (viewed optically, probed or otherwise analyzed).

When milling away die material, for example, using a $XeF_2$ gas needle, the die can shift relative to the visual view provided by an optical microscope. It is therefore helpful to use commercially available equipment, such as provided by Micrion, Inc., that maintains alignment for visual tracking. Such equipment is especially helpful when milling the smaller window where misalignment due to shifting is much less tolerable. Once milling is completed, the circuit may be accessed or analyzed, for example using IR imaging and an overlay of the intended circuit design for comparison.

The selected area for milling to may also, for example, be marked during the fabrication of the chip by implanting a marker within the substrate. The marker may include a shape, such as an "X" or a letter. The implanted marker may make it easier to detect the location of the selected region within the device.

Figure 3:
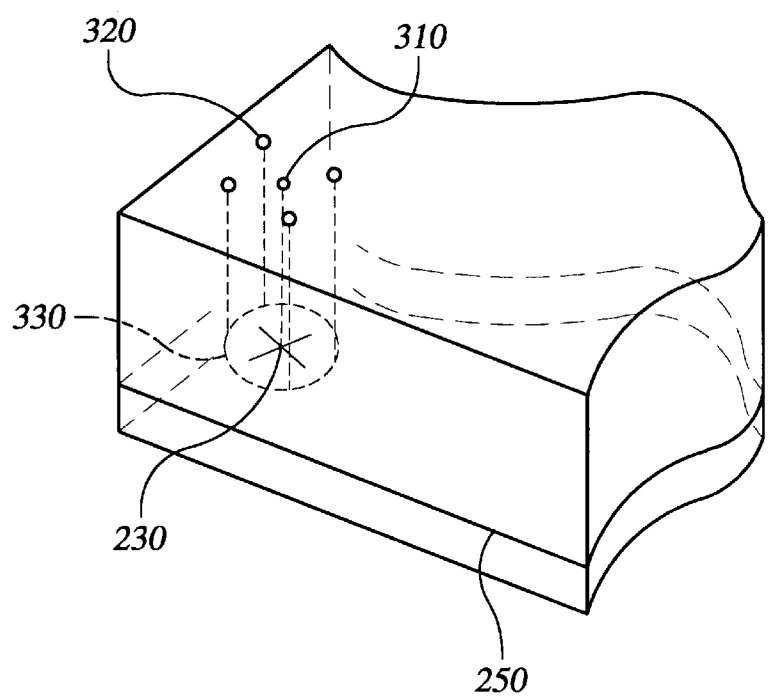
FIG. 3 is an enlarged partial view of a flip-chip die with four laser zaps arranged to be aligned above a perimeter of an area around a selected area in the substrate, and a smaller laser zap aligned over the center of the selected area in the substrate, all of which is in accordance with the present invention.

FIG. 3 is an enlarged partial view of a flip-chip die with four laser zaps 320 arranged to be aligned above a perimeter 330 of an area around a selected area 230 in the substrate, and a smaller laser zap 310 aligned over the center of the selected area 230 in the substrate. The hidden object lines, which represent the substrate as in FIG. 2, have been omitted for clarity. The selected region 230 and perimeter 330 are in the plane represented by edge 250.

For example, a laser sweep may be used to locate circuitry within the device. Once the circuitry is located, laser zaps may be created on the surface of the back side of the device which correspond with a perimeter around the circuitry within the device. Once the perimeter laser zaps have been created, a relatively smaller laser zap may be created in the center of the perimeter zaps. The size of the perimeter laser zaps may vary depending on various factors, such as the targeted area for analysis, the resolution of the equipment, and the experience and preferences of the operator conducting the analysis. The location of the smaller zap then corresponds with the location of the center of the circuitry within the device, and may be used as a guide for milling the device.

One advantage of using perimeter laser zaps before creating the center zap is that the center zap may then be made smaller. Using a smaller zap for identifying the location of the circuitry within the device is more accurate than using a larger zap because the center-point of a smaller zap is easier to locate. Another advantage of using perimeter laser zaps is that the location of the center zap itself may then be easier to determine and more accurate.

Figure 4:
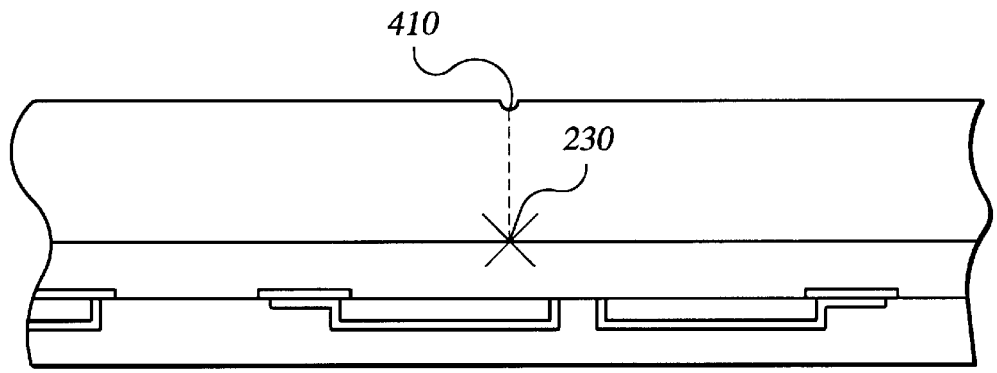
FIG. 4 is an enlarged cut-away side view of a flip-chip die showing the location of a selected region over which a laser zap has been created, also in accordance with the present invention.

FIG. 4 is an enlarged, not-to scale, cut-away side view of a flip-chip die showing an example location of a selected region 230 over which a laser zap 410 has been created.

Figure 5:
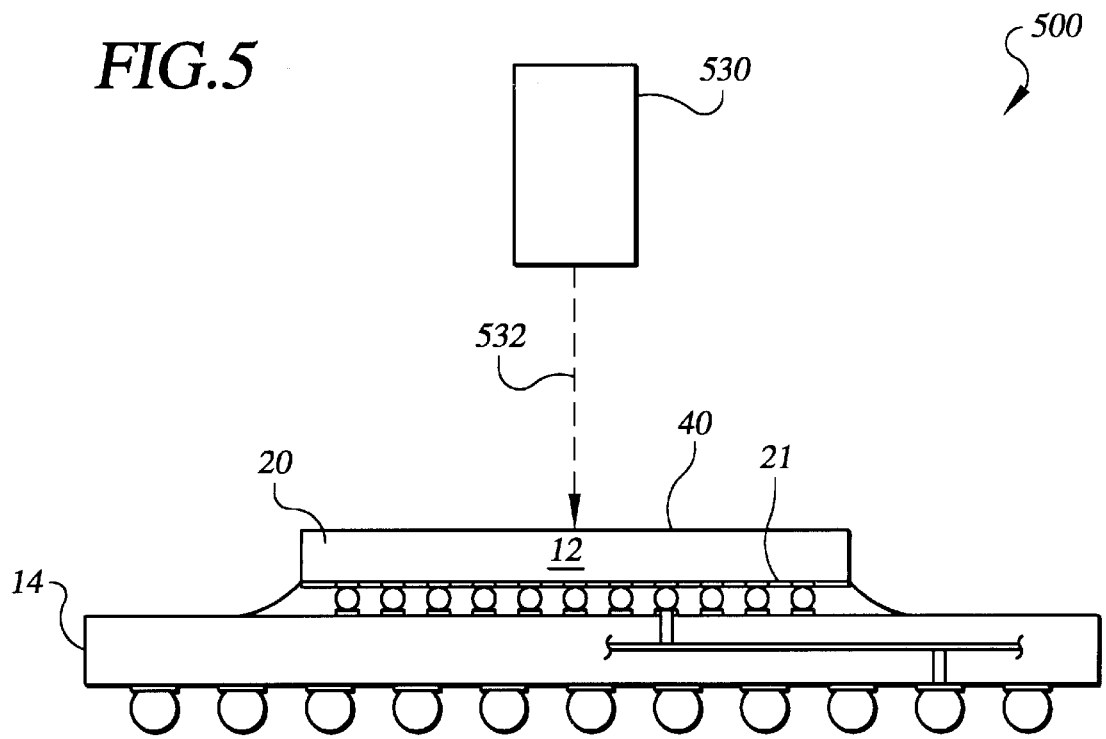
FIG. 5 shows an example system for creating a laser zap in the surface of the back side of a flip-chip die, according to the present invention.

FIG. 5 shows a schematic view of an example system 500 for creating laser zaps on the surface of the substrate 20 of a flip-chip type die 12 attached to a package substrate or surface 14, according to an example embodiment of the present invention. The system includes a laser apparatus 530 for removing portions of the die. Laser apparatus 530 may, for example, be an apparatus as available from Micrion, Inc. The laser apparatus 530 produces a laser beam 532 which can be a used to create a laser zap in the back side surface 40. The laser beam 232 can also be used to scan for a selected region within the die 12.

For instance, laser apparatus 530 may be used to scan through the substrate 20 to identify selected regions within the device. The selected regions may include components of the circuitry within the device. An example of such a selected region is illustrated as a cross in the form of an "X" in FIGS. 2–4. Once the selected region is identified, the laser apparatus 530 may be used to create a laser zap, such as laser zap 210 in FIG. 2, zaps 310 and 320 in FIG. 3, or zap 410 in FIG. 4. The selected region in the device may then be milled to, using the laser zap or zaps as a guide.

In another example, laser apparatus 530 may be used to globally thin the die first, enabling better detection of the selected region within the substrate. Once the die has been globally thinned, the laser may be used to sweep the device and detect the selected region. Once the selected region is identified, the laser apparatus 530 may be used to create a laser zap as illustrated in FIGS. 2–4. The selected region in the device may then be milled to, using the laser zap or zaps as a guide.

While the invention is amenable to various modifications and alternative forms, specifics thereof have been shown by way of example in the drawings and will be described in detail. It should be understood, however, that the intention is not to limit the invention to the particular embodiment described. On the contrary, the invention is to cover all modifications, equivalents, and alternatives falling within the spirit and scope of the invention as defined by the appended claims.

What is claimed is:

1. A method for milling the substrate of a semiconductor device and exposing a selected region in the substrate, the semiconductor device having a circuit side and a back side, the back side having at least two layers, the method comprising:

using a burst of laser light to provide at least one reference mark on the back side of the semiconductor device;

optically aligning an access equipment relative to the reference mark, the access equipment aligned for accessing a selected region in the substrate;

removing substrate with the access equipment to provide an access area; and accessing the selected region in the substrate via the access area.

2. The method of claim 1, wherein the semiconductor device further comprises an implanted marker within the substrate and further including the step of using the implanted marker to determine at least one of: the depth into the semiconductor device, and a lateral position relative to the selected region.

3. The method of claim 1, wherein using a burst of laser light includes providing a plurality of reference marks on the back side of the semiconductor device and using the marks for optical alignment.

4. The method of claim 3, further including using the plurality of reference marks for coarse optical alignment and providing another reference mark on the back side of the semiconductor device and using the other reference mark for fine optical alignment.

5. The method of claim 4, wherein removing substrate with the access equipment to provide an access area includes etching via a focused ion beam.

6. The method of claim 4, wherein accessing the selected region in the substrate via the access area includes using IR imaging and comparing results of the IR imaging to a desired device arrangement.

7. The method of claim 4, wherein accessing the selected region in the substrate via the access area includes forming a first window in the semiconductor device and then forming a second window over the selected region within the first window, the step of using IR imaging occurring via the first window.

8. The method of claim 1, wherein accessing the selected region in the substrate via the access area includes using IR imaging and comparing results of the IR imaging to a desired device arrangement.

9. The method of claim 1, further including using optical microscopy for alignment.

10. The method of claim 1, wherein removing substrate includes applying a focused ion beam at the back side of the device.

11. The method of claim 1, wherein using a burst of laser light to provide at least one reference mark on the back side of the semiconductor device includes at least one of the following:

aligning the laser relative to the selected region within the substrate;

removing a small amount of material from the surface of the back side of the substrate with the laser device in distinct areas in a pattern around the selected region, thereby creating multiple laser zaps; and removing a small amount of material in the center of the pattern, creating a shallow laser zap over the selected region within the substrate.

12. A method for accessing and exposing a selected region in a semiconductor device, the semiconductor device having a circuit side and a back side, the back side having at least two layers, the method comprising:

providing at least one reference mark on the back side of the semiconductor device;

optically aligning an access equipment relative to the reference mark, the access equipment aligned for accessing a selected region in the substrate, wherein the access equipment is used to form an access area to provide access to the selected region; and accessing the selected region in the substrate via the access area.

13. A method for aligning a semiconductor device for analysis, the semiconductor device having a circuit side and a back side, the back side having at least two layers, the method comprising:

making at least one reference mark on the back side of the semiconductor device;

optically aligning analysis equipment relative to the reference mark; and analyzing the semiconductor device from the back side via the optically aligned analysis equipment.

14. The method of claim 13, wherein making at least one reference mark includes directing a laser at the back side and making a mark on the back side with the laser.

15. The method of claim 13, wherein making at least one reference mark comprises:

directing a laser at the back side of the device and heating circuitry therein;

detecting an IR image of the heated circuitry; and using the IR image, directing the laser at the back side and making a mark that identifies the location of imaged circuitry.

\* \* \* \* \*

UNITED STATES PATENT AND TRADEMARK OFFICE
CERTIFICATE OF CORRECTION

PATENT NO.    : 6,417,068 B1                                              Page 1 of 1
DATED         : July 9, 2002
INVENTOR(S)   : Bruce et al.

It is certified that error appears in the above-identified patent and that said Letters Patent is hereby corrected as shown below:

Column 2,
Line 26, "silicon an area" should read -- silicon area --.
Line 59, "simple approaching" should read -- simple solution to approaching --.

Column 3,
Line 21, "analysed" should read -- analyzed --.

Column 5,
Line 38, "12, The" should read -- 12. The --.

Column 6,
Line 10, "comers" should read -- corners --.

Signed and Sealed this

Twenty-sixth Day of November, 2002

Attest:

JAMES E. ROGAN
Attesting Officer                Director of the United States Patent and Trademark Office